United States Patent
Kim

(10) Patent No.: US 9,691,466 B1
(45) Date of Patent: Jun. 27, 2017

(54) MEMORY DEVICE INCLUDING REFRESH CONTROLLER

(71) Applicant: SK hynix Inc., Gyeonggi-do (KR)

(72) Inventor: Chang-Hyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/331,030

(22) Filed: Oct. 21, 2016

(30) Foreign Application Priority Data

Jun. 3, 2016 (KR) .................. 10-2016-0069302

(51) Int. Cl.
*G11C 11/406* (2006.01)
*G11C 11/408* (2006.01)

(52) U.S. Cl.
CPC .......... *G11C 11/406* (2013.01); *G11C 11/408* (2013.01); *G11C 11/40611* (2013.01); *G11C 11/40615* (2013.01)

(58) Field of Classification Search
CPC ............. G11C 11/406; G11C 11/40611; G11C 11/40615; G11C 11/408
USPC ........................................ 365/222, 230.01
See application file for complete search history.

(56) References Cited

U.S. PATENT DOCUMENTS

| | | | | |
|---|---|---|---|---|
| 2002/0147885 A1* | 10/2002 | Mobley | ................. | G11C 11/406 711/106 |
| 2007/0033339 A1* | 2/2007 | Best | ..................... | G11C 11/406 711/106 |
| 2008/0253212 A1* | 10/2008 | Iida | ........................ | G11C 11/406 365/222 |
| 2009/0238021 A1* | 9/2009 | Ban | ......................... | G11C 7/22 365/222 |
| 2011/0161578 A1* | 6/2011 | Kim | ..................... | G11C 11/406 711/106 |
| 2014/0189215 A1* | 7/2014 | Kang | ................. | G11C 11/40603 711/103 |
| 2015/0206575 A1* | 7/2015 | Morgan | ............ | G11C 11/40611 365/222 |
| 2016/0055896 A1* | 2/2016 | Lim | ..................... | G11C 11/408 365/149 |
| 2017/0047110 A1* | 2/2017 | Kang | ................. | G11C 11/4087 |

FOREIGN PATENT DOCUMENTS

| | | |
|---|---|---|
| KR | 1020130117198 | 10/2013 |
| KR | 1020150033949 | 4/2015 |

* cited by examiner

*Primary Examiner* — Ly D Pham
(74) *Attorney, Agent, or Firm* — IP & T Group LLP

(57) ABSTRACT

A memory device may include: a target address generator suitable for storing one or more addresses for each time a refresh command is skipped, and for generating one or more target addresses for each of the stored addresses during a burst refresh operation; and a refresh controller suitable for refreshing a word line selected among a plurality of word lines of a memory bank based on the generated one or more target addresses during a target refresh operation.

20 Claims, 9 Drawing Sheets

MEMORY DEVICE INCLUDING REFRESH CONTROLLER

CROSS-REFERENCE TO RELATED APPLICATIONS

This U.S. non-provisional patent application claims priority under 35 U.S.C. §119(a) to Korean Patent Application No. 10-2016-0069302, filed on Jun. 3, 2016 in the Korean Intellectual Property Office (KIPO), the disclosure of which is incorporated herein by reference in its entirety.

BACKGROUND

1. Field

Embodiments of the present invention relate generally to a memory device including a refresh controller.

2. Description of the Related Art

A memory cell of a memory device includes a transistor serving as a switch for controlling the flow of charges in and out of a capacitor which stores the charges. The charges of course represent data and, more specifically, according to the level of the voltage of the capacitor, data may be high logic (logic 1) or low logic (logic 0).

Retaining the data requires maintaining the charges in the capacitor. Because, charges may leak due to the PN junction of a MOS transistor, the data may be lost. Hence, to prevent data loss, the charges are read before the data is lost, and recharged periodically a process generally referred to as a refresh operation.

Typically, a refresh operation is performed whenever a refresh command is inputted to a memory from a memory controller. Considering the data retention time of the memory, the memory controller inputs the refresh command to the memory at each set time. The data retention time indicates a time during which data of a memory cell can be retained without a refresh operation. Since memory cells included in a memory device are designed to have a data retention time equal to or more than a reference retention time, the interval between refresh operations may be determined in consideration of the reference retention time.

However, when the charge of a certain memory cell is influenced by an active-precharge operation of a word line adjacent to a word line to which the corresponding memory cell is coupled, the data of the memory cell may be deteriorated within a shorter time than the refresh interval. Such a phenomenon is referred to as a row hammering effect.

FIG. 1 is a diagram illustrating a part of a cell array included in a memory device, in order to describe the row hammer effect. In FIG. 1, BL represents a bit line.

Referring to FIG. 1, WLK−1, WLK and WLK+1 represent three adjacent word lines which are arranged in parallel within the cell array. WLK with ATTACK_ACT represents a word line of which the active count or frequency is high or the active time is long, and WLK−1 and WLK+1 represent word lines adjacent to the word line WLK. CELL_K−1, CELL_K and CELL_K+1 represent memory cells coupled to the word lines WLK−1, WLK and WLK+1, respectively. The memory cells CELL_K−1, CELL_K and CELL_K+1 may include cell transistors TR_K−1, TR_K and TR_K+1 and cell capacitors CAP_K−1, CAP_K and CAP_K+1, respectively.

In FIG. 1, when the word line WLK is frequently activated or activated for a long time, the voltage of the word line WLK frequently toggles or is retained at a high voltage for a long time. Then, a coupling effect between the word line WLK and the word lines WLK−1 and WLK+1 may have an influence on data stored in the memory cells CELL_K−1 and CELL_K+1 coupled to the word lines WLK−1 and WLK+1. Such an influence can reduce the time during which the data stored in the memory cells can be retained and is generally known as the word line or row hammer effect.

SUMMARY

Various embodiments of the present invention are directed to a memory device capable of properly performing a target refresh operation during a burst refresh operation which is performed after a refresh operation is skipped one or more times.

In an embodiment, a memory device may include: a target address generator suitable for storing one or more addresses for each time a refresh command is skipped, and for generating one or more target addresses for each of the stored addresses during a burst refresh operation; and a refresh controller suitable for refreshing a word line selected among a plurality of word lines of a memory bank based on the generated one or more target addresses during a target refresh operation.

In an embodiment, a memory device may include: a plurality of word lines; a control signal generator suitable for enabling a control signal in response to a refresh command, enabling the control signal at a set interval during a refresh skip operation, and disabling the control signal during a burst refresh operation; a target address generator comprising a plurality of address storage units, and suitable for sequentially primarily selecting the plurality of address storage units one by one whenever the control signal is activated and storing a row hammering address in the primarily selected address storage units, and sequentially secondarily selecting the plurality of address storage units one by one whenever the refresh operation is ended and generating a target address using addresses stored in the secondarily selected address storage units; and a refresh controller suitable for refreshing a word line corresponding to the target address among the plurality of word lines, during a target refresh operation.

In an embodiment of the present invention, a memory device may include: a plurality of word lines coupled to a plurality of memory cells; a target address generator including at least two address storage units configured to store at least two row hammering addresses, and suitable for generating a plurality of target addresses in response to the row hammering addresses during a burst refresh operation; and a refresh controller suitable for refreshing the memory cells coupled to a plurality of selected word lines among the word lines in response to the target addresses during the burst refresh operation, wherein the at least two row hammering addresses corresponds to a number of times where a refresh command is skipped.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
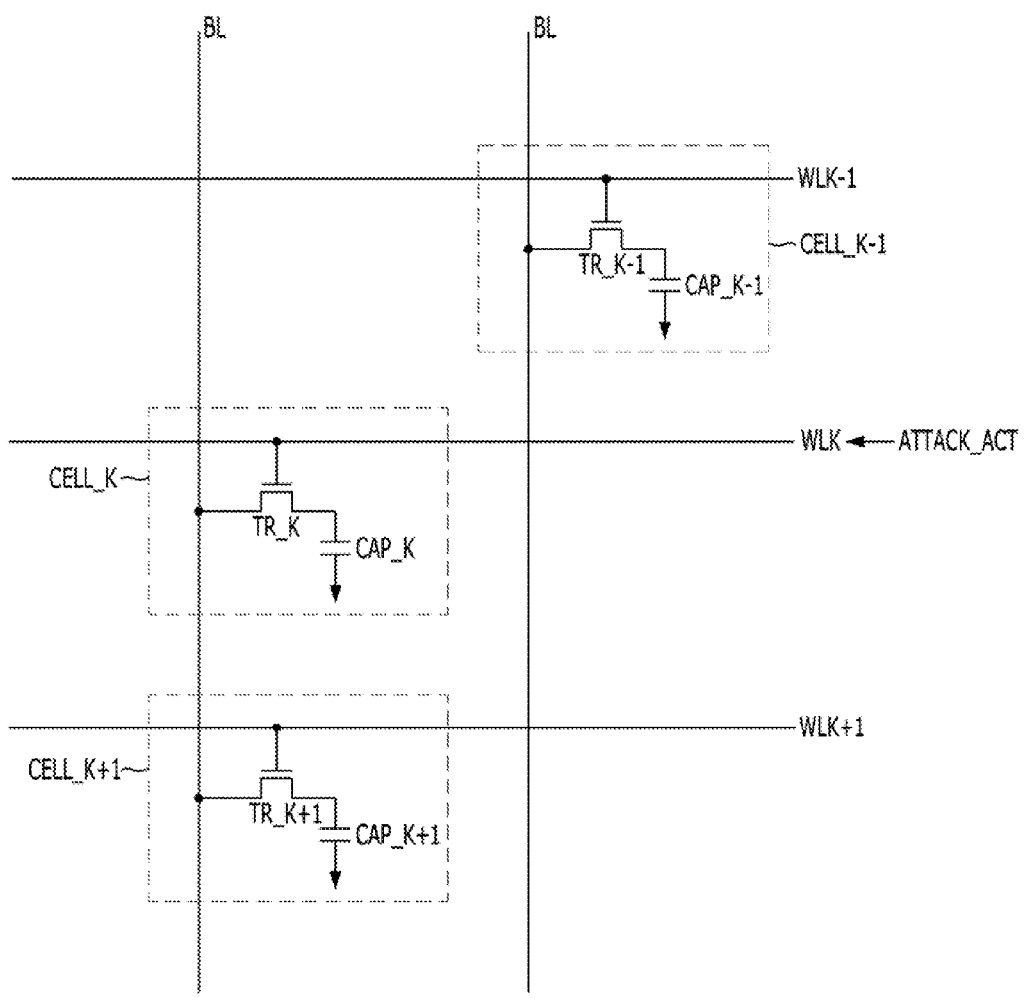
FIG. 1 is a diagram illustrating a part of a cell array included in a memory device, in order to describe the row hammer effect.

Various embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereafter, a normal refresh operation may indicate an operation of refreshing a word line corresponding to a counting address, and a target refresh operation may indicate an operation of refreshing a word line corresponding to a target address.

Hereinafter, the various embodiments of the present invention will be described in detail with reference to the attached drawings.

Figure 2:
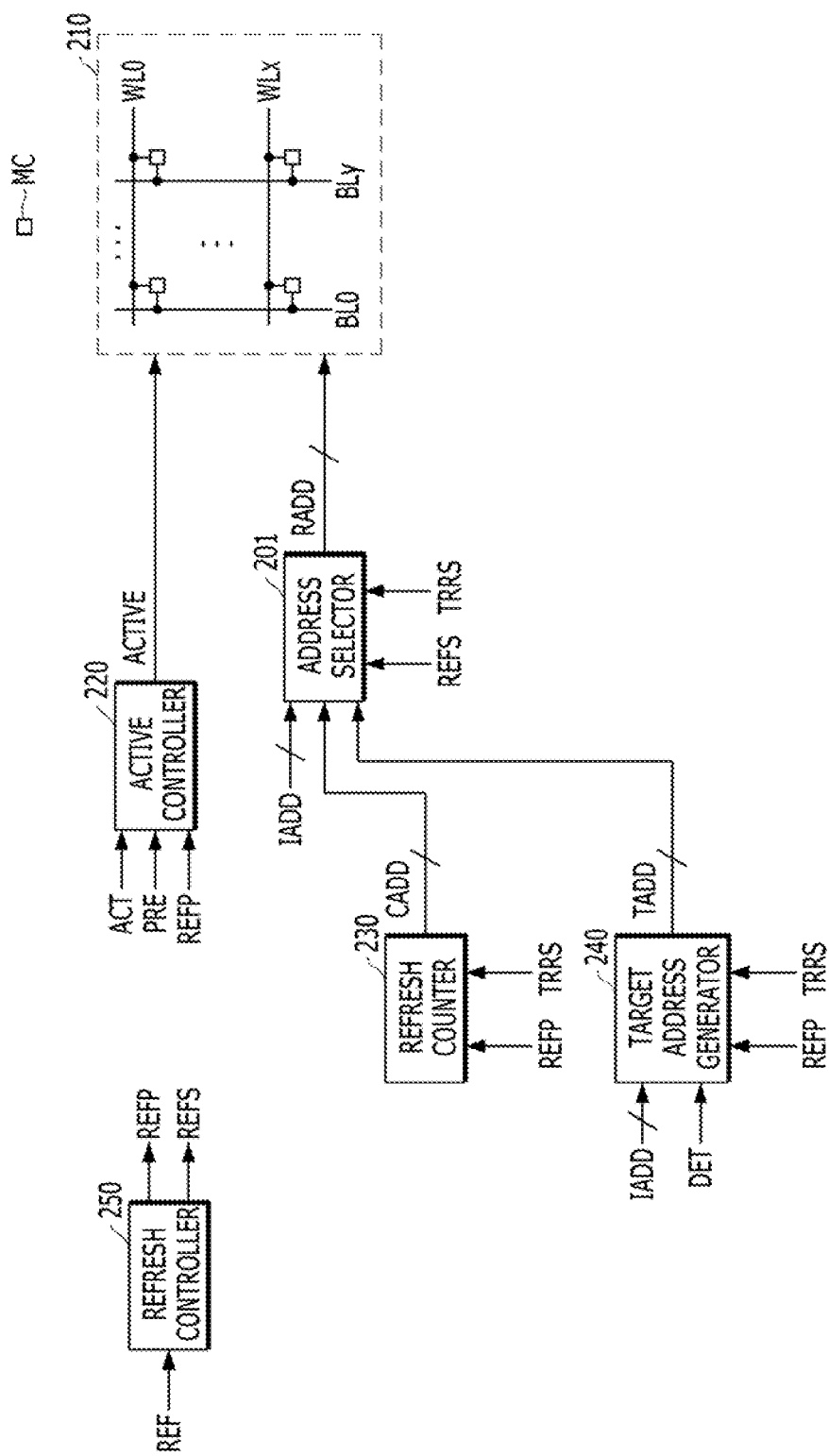
FIG. 2 is a configuration diagram of a memory device which performs a target refresh operation.

FIG. 2 is a configuration diagram of a memory device which performs a target refresh operation.

Referring to FIG. 2, the memory device may include a memory bank 210, an active controller 220, a refresh counter 230, a target address generator 240, a refresh controller 250 and an address selector 201.

The memory bank 210 may include a plurality of word lines WL0 to WLx, a plurality of bit lines BL0 to BLy, and a plurality of memory cells MC coupled between the word lines and the bit lines, where x and y are natural numbers. The memory bank 210 may include circuits for controlling the word lines WL0 to WLx and the bit lines BL0 to BLy and writing data to the memory cells or reading data of the memory cells, which are well known in the art and as such are not are not illustrated in FIG. 2.

The memory bank 210 may activate a word line corresponding to a row address RADD received from the address selector during an active period of an active signal ACTIVE received from the active controller 220.

The address selector 201 may select an input address IADD and output the selected input address as the row address RADD. When a refresh section signal REFS is activated at a refresh operation section, the address selector 201 may select a counting address CADD and output the selected signal as the row address RADD, and when a target refresh section signal TRRS is activated at a target refresh operation section, the address selector 201 may select a target address TADD and output the selected address as the row address RADD.

The active controller 220 may enable the active signal ACTIVE in response to an active command ACT, and disable the active signal ACTIVE in response to a precharge command PRE. The active controller 220 may activate the active signal ACTIVE during a set period, in response to a refresh signal REFP.

When the refresh signal REFP is activated, the refresh counter 230 may perform counting to generate the counting address CADD. For example, when the refresh signal REFP is activated, the refresh counter 230 may increase the value of the counting address CADD by 1. When the value of the counting address CADD is increased by 1, it may indicate that the counting address CADD is changed to select the (K+1)th word line this time in case where the Kth word line was selected last time. However, when the target refresh section signal TRRS is enabled, the refresh counter 230 may not perform counting even though the refresh signal REFP is enabled, but retain the value of the counting address CADD.

The target address generator 240 may store the address of a row hammering word line between points of time that the refresh command REF is applied. The address of the row hammering word line will be hereafter referred to as a row hammering address. The row hammering word line may indicate a word line of which the active count or frequency is equal to or more than a reference count or frequency or which satisfies other conditions that may deteriorate data of memory cells coupled to word lines adjacent thereto. The row hammering word line may be detected by detecting logic or a memory controller in the memory device. The detection signal DET is enabled when the activated word line is a row hammering word line.

In the memory device of FIG. 2, the target address generator 240 may store one address. When the detection signal DET is enabled, the target address generator 240 stores an input address IADD which is a row hammering address. When the refresh signal REFP is enabled in a state where the target refresh section signal TRRS is enabled, the target address generator 240 may generate a target address TADD by adding or subtracting a set value to or from the stored address. For example, when the refresh signal REFP is enabled for the first time in a state where the target refresh section signal TRRS is activated, the target address generator 240 may generate a target address TADD by subtracting 1 from the stored address, and the target address TADD will be hereafter referred to as a first target address. When the refresh signal REFP is enabled for the second time, the target address generator 240 may generate a target address TADD by adding 1 to the stored address, and the target address TADD will be hereafter referred to as a second target address.

The refresh controller 250 may generate the refresh signal REFP and the refresh section signal REFS in response to the refresh command REF. When the refresh command REF is applied, the refresh controller 250 may activate the refresh section signal REFS during a refresh section in which a refresh operation is performed, and enable the refresh signal REFP one or more times during the refresh section. Hereafter, suppose that the refresh controller 250 enables the refresh signal REFP three times during the refresh section.

When the refresh signal REFP is enabled for the first time, a word line corresponding to the counting address CADD may be refreshed. Then, when the target refresh section signal TRRS is enabled and the refresh signal REFP is enabled for the second time, a word line corresponding to the first target address TADD may be refreshed, and when the refresh signal REFP is enabled for the third time, a word line corresponding to the second target address TADD may be refreshed.

The target address generator 240 may store one address between two adjacent refresh commands. A target refresh operation using the stored address may be performed in response to the latter refresh command between the two adjacent refresh commands.

Figure 3:
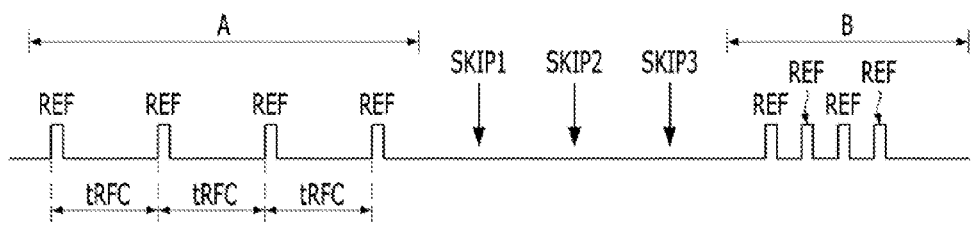
FIG. 3 is a diagram describing an equal-interval refresh operation and a bust refresh operation.

FIG. 3 is a diagram for describing an equal-interval refresh operation and a bust refresh operation.

The number of refresh commands REF which the memory controller (not illustrated in FIG. 2) applies to the memory bank 210 during a preset time may be preset according to design. Referring to FIG. 3, the refresh command REF may be applied at equal intervals (tRFC) in the case of the equal-interval refresh operation (section A). At this time, the equal interval (tRFC) may be set to equal a value derived by dividing the set time by the designed number of refresh commands REF to be performed during the set time.

In an embodiment, the memory controller may skip refresh commands REF which are to be applied at set time points, as indicated by SKIP1, SKIP2 and SKIP3. In such a case, in order to apply all refresh commands REF corresponding to the designed number during a set time, the memory controller after the skipping period of SKIP1, SKIP 2, and SKIP3, may successively apply the remaining preset number of refresh commands REF at a shorter interval than the equal-interval refresh operation, so that they may performed within the preset period. In other words, the memory controller may compensate for the skipped refresh commands REF. Such a refresh operation is referred to as a burst refresh operation (section B).

Figure 4A:
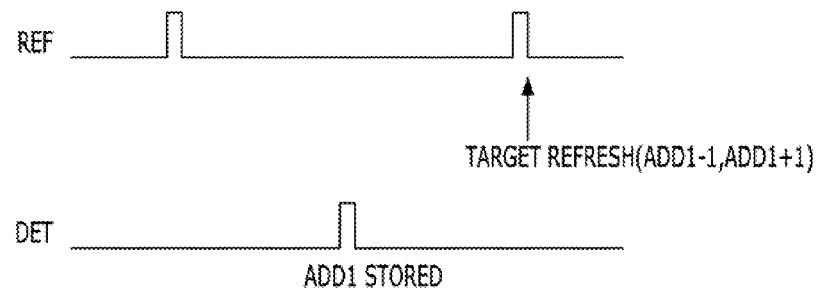
FIG. 4A is a diagram describing normal and target refresh operations of the memory device of FIG. 2.

FIG. 4A describes the normal and target refresh operations of the memory device of FIG. 2.

Referring to FIG. 4A, when the refresh commands REF are applied at equal intervals, one address (for example, ADD1) may be stored in the target address generator 240 in case where the detection signal DET is activated between two adjacent refresh commands REF, and a target refresh operation using the stored address ADD1 may be performed in response to the latter refresh command REF between the two adjacent refresh commands REF. For example, a first target address may be set to ADD1−1, and a second target address may be set to ADD1+1. Hence, in this example, illustrated in FIG. 4A, word lines corresponding to the addresses ADD1−1 and ADD1+1 the data of which are subject to deterioration due to a row hammering effect are immediately refreshed through the target refresh operation, thus preventing the row hammering effect.

Figure 4B:
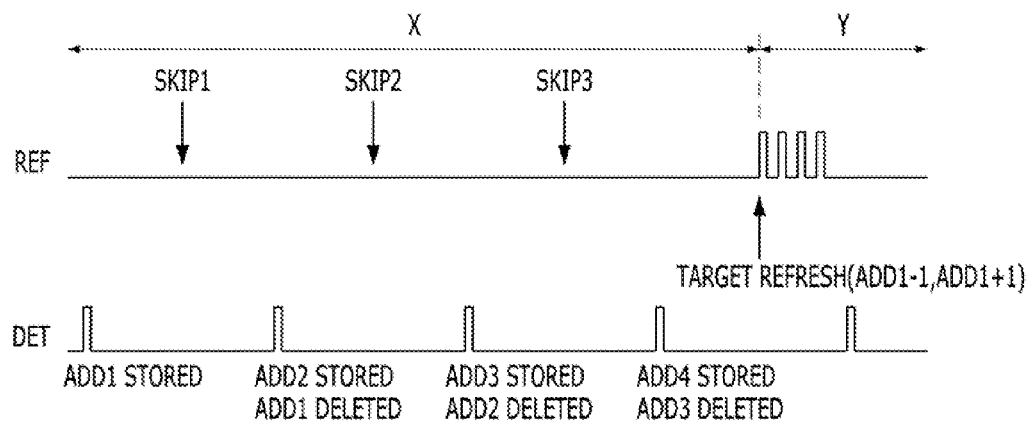
FIG. 4B is a diagram describing a problem which may occur during normal and target refresh operations of the memory device of FIG. 2.

FIG. 4B is a diagram describing a problem which may occur during the normal and target refresh operations of the memory device of FIG. 2.

Referring to FIG. 4B, target refresh operations for addresses ADD1 to ADD3 stored in the target address generator 240 cannot be performed in a section X where refresh commands REF are skipped as indicated by SKIP1, SKIP2 and SKIP3. That is because, since the target address generator 240 can store only one address, the address ADD1 is deleted the moment the address ADD2 is stored, the address ADD2 is deleted the moment the address ADD3 is stored, and the address ADD3 is deleted the moment the address ADD4 is stored.

Thus, although the target refresh operations using the ADD1 to ADD4 need to be performed during a burst refresh operation section Y, only the target refresh operation using the address ADD4 is performed. Thus, it is difficult for the memory device to properly cope with data deterioration caused by the row hammering effect.

Figure 5:
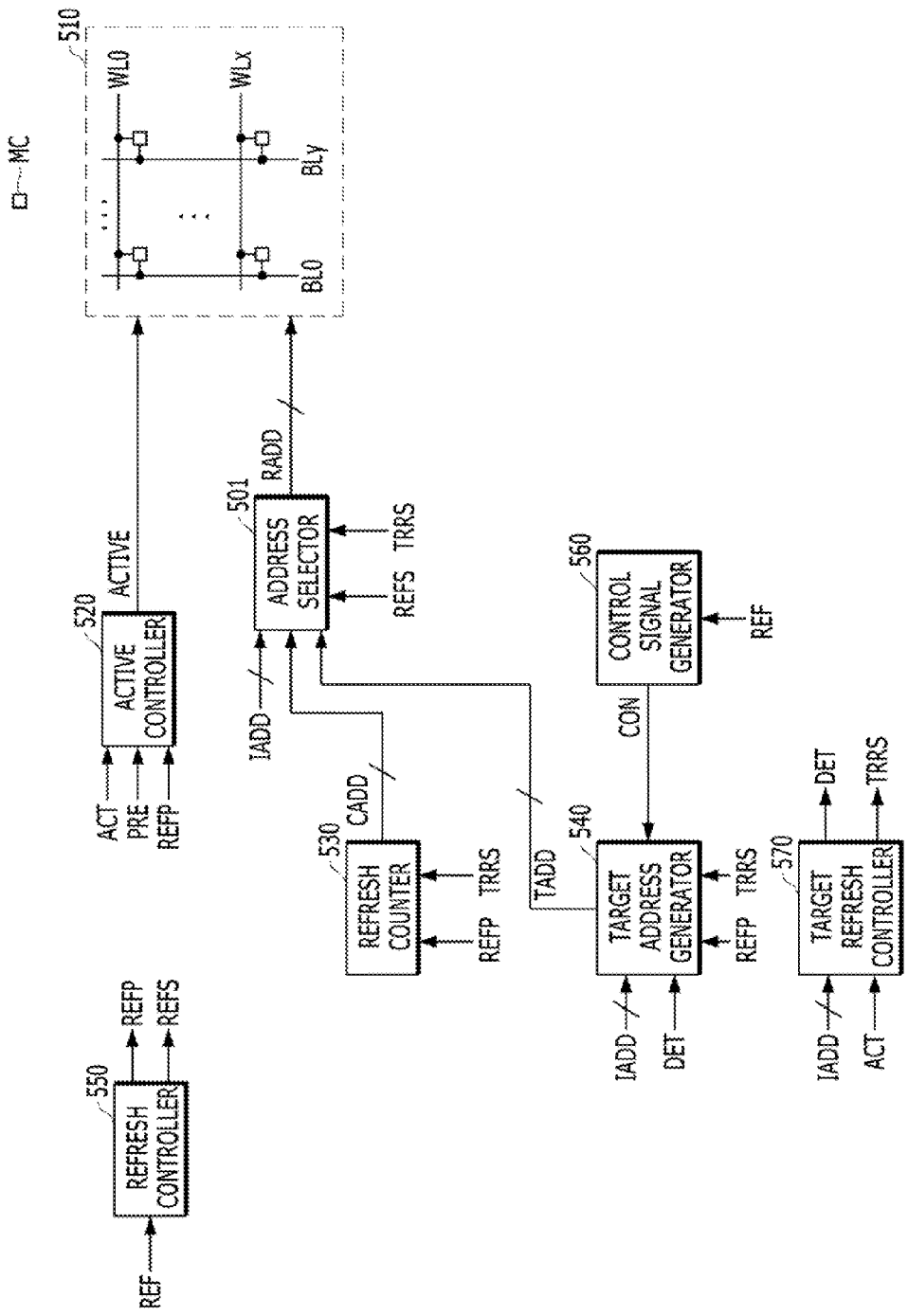
FIG. 5 is a configuration diagram of a memory device, in accordance with an embodiment of the present invention.

FIG. 5 is a configuration diagram of a memory device, in accordance with an embodiment of the present invention.

Referring to FIG. 5, the memory device may include a memory bank 510, an active controller 520, a refresh counter 530, a target address generator 540, a refresh controller 550, a control signal generator 560, a target refresh controller 570 and an address selector 501.

The memory bank 510, the active controller 520, the refresh counter 530, the refresh controller 550 and the address selector 501 may be configured and operated in the same manner as the corresponding memory bank 210, the active controller 220, the refresh counter 230, the refresh controller 250 and the address selector 201 of the memory device of FIG. 2.

The target refresh controller 570 may detect a row hammering address using an input address IADD and an active command ACT, and enable a detection signal DET when the row hammering address is detected. The target refresh controller 570 may detect a word line of which the active count or frequency is equal to or more than a reference count or frequency or which satisfies other conditions which deteriorate data of memory cells coupled to adjacent word lines, using the input address IADD and the active command ACT. When the input address IADD and the active command ACT are used, the active count and frequency of each word line can be recognized. A row hammering address may be detected through various methods.

When a row hammering word line is detected between two adjacent refresh commands REF, the target refresh controller 570 may enable a target refresh section signal TRRS during a set section, in response to the latter refresh command REF between the two adjacent refresh commands REF. The set section may indicate a section required for performing a target refresh operation using a target address which is generated through a stored address. For example, when the refresh signal REFP is enabled three times in response to the refresh command REF, the target refresh controller 570 may enable the target refresh section signal TRRS in a section where two refresh signals REFP of the three refresh signals REFP are included. In addition, the target refresh controller 570 may enable the target refresh section signal TRRS in other sections where a target refresh operation is required.

The control signal generator 560 may detect a skip of the refresh command and a burst refresh operation, and generate a control signal CON for controlling the target address generator 540. The control signal generator 560 may enable the control signal CON in response to the refresh command REF in a section where the refresh command REF is applied at a first interval, enable the control signal CON at a second interval equal to or longer than the first interval during a skip operation section where the refresh command REF is not applied for a longer time than the first interval, and disable the control signal CON during a burst refresh operation section where the refresh command REF is applied at a third interval shorter than the first interval.

Hence, unlike the target address generator 240 of FIG. 2, the target address generator 540 of FIG. 5 may store a plurality of row hammering addresses. The target address generator 540 may store a plurality of addresses the number of which corresponds to the number of times the refresh command REF is skipped. The target address generator 540 may also generate one or more target addresses using the stored address or addresses during a burst refresh operation. When the number of times the refresh command REF was skipped is k where k is 0, 1, 2, . . . , the target address generator 540 may store (k+1) row hammering addresses during a section where the refresh command REF was skipped. For example, when the number of times the refresh command REF was skipped is 3, the target address generator 540 may store four row hammering addresses.

Figure 6:
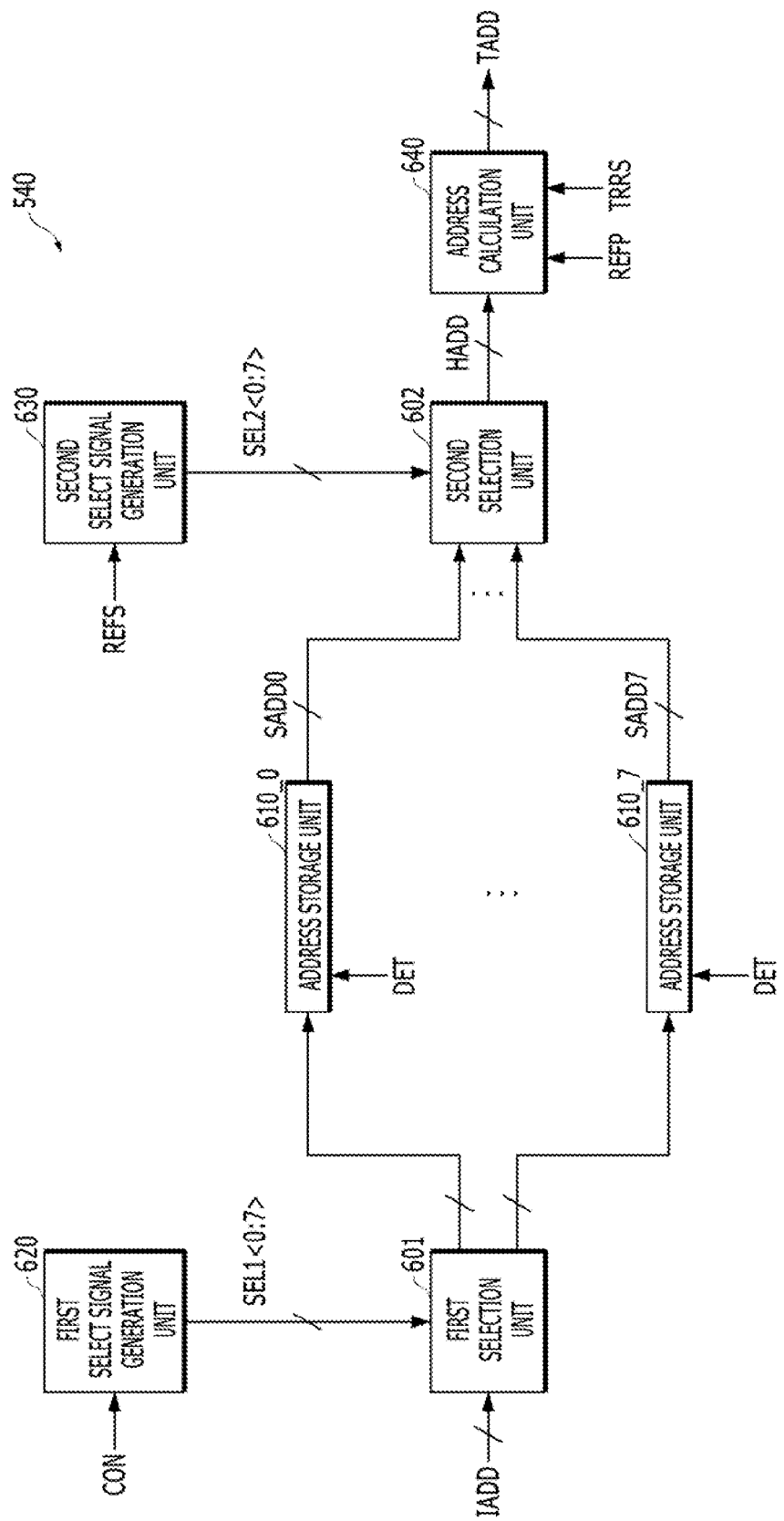
FIG. 6 is a configuration diagram of a target address generator of the memory device of FIG. 5.

FIG. 6 is a configuration diagram of the target address generator 540.

Referring to FIG. 6, the target address generator 540 may include a plurality of address storage units 610_0 to 610_7, first and second select signal generation units 620 and 630, an address calculation unit 640 and first and second selection units 601 and 602.

Each of the address storage units 610_0 to 610_7 may store one address and output the stored address. When the detection signal DET is activated, the plurality of addresses storage units 610_0 to 610_7 may store input addresses, and output the stored addresses as addresses SADD0 to SADD7, respectively.

When the control signal CON is enabled, the first select signal generation unit 620 may perform counting to generate a plurality of first select signals SEL1<0:7> corresponding to the respective address storage units 610_0 to 610_7. The first select signal generation unit 620 may enable the first select signal SEL1<0> of the first select signals SEL1<0:7> in the initial state, and sequentially enable the first select signals SEL1<0:7> whenever the control signal CON is enabled. When the control signal CON is enabled in a state where the first select signal SEL1<7> is enabled, the first select signal generation unit 620 may perform counting to enable the first select signal SEL1<0>, and repeat the above-described operation.

When a refresh operation is ended, the second select signal generation unit 630 may perform counting to generate a plurality of second select signals SEL2<0:7> corresponding to the respective address storage units 610_0 to 610_7. When the refresh section signal REFS transitions from an active state to an inactive state, the second select signal generation unit 630 may perform counting to generate the second select signals SEL2<0:7>. The second select signal generation unit 630 may enable the second select signal SEL2<0> of the second select signals SEL2<0:7> in the initial state, and sequentially enable the second select signals SEL2<0:7> whenever the refresh section signal REFS transitions to an inactive state. When the refresh section signal REFS transitions to an inactive state in a state where the second select signal SEL2<7> is enabled, the second select signal generation unit 630 may perform counting to activate the second select signal SEL2<0>, and repeat the above-described operation.

The first selection unit 601 may input the input address IADD to an address storage unit corresponding to an enabled first select signal, among the address storage units 610_0 to 610_7. For example, the first selection unit 601 may input the input address IADD to the address storage unit 610_3 when the first select signal SEL1<3> is enabled.

The second selection unit 602 may select an address outputted from an address storage unit corresponding to an enabled second select signal, among the address storage units 610_0 to 610_7, and output the selected address as an address HADD. For example, the second selection unit 602 may select the address SADD3 outputted from the address storage unit 620_3 when the second select signal SEL2<3> is enabled, and output the selected address as the address HADD.

The address calculation unit 640 may generate a target address TADD by adding or subtracting a set value to or from the address HADD outputted from the second selection unit 602. For example, the address calculation unit 640 may generate the target address TADD by adding or subtracting 1 to or from the output address HADD. When the refresh signal REFP is enabled two times in a state where the target refresh section signal TRRS is activated, the address calculation unit 640 may generate the target address TADD by subtracting 1 from the output address HADD in response to one of the two refresh signals REFP, and generate the target address TADD by adding 1 to the output address HADD in response to the other refresh signal REFP. Thus, the target address TADD may have a value of HADD−1 or HADD+1.

Figure 7:
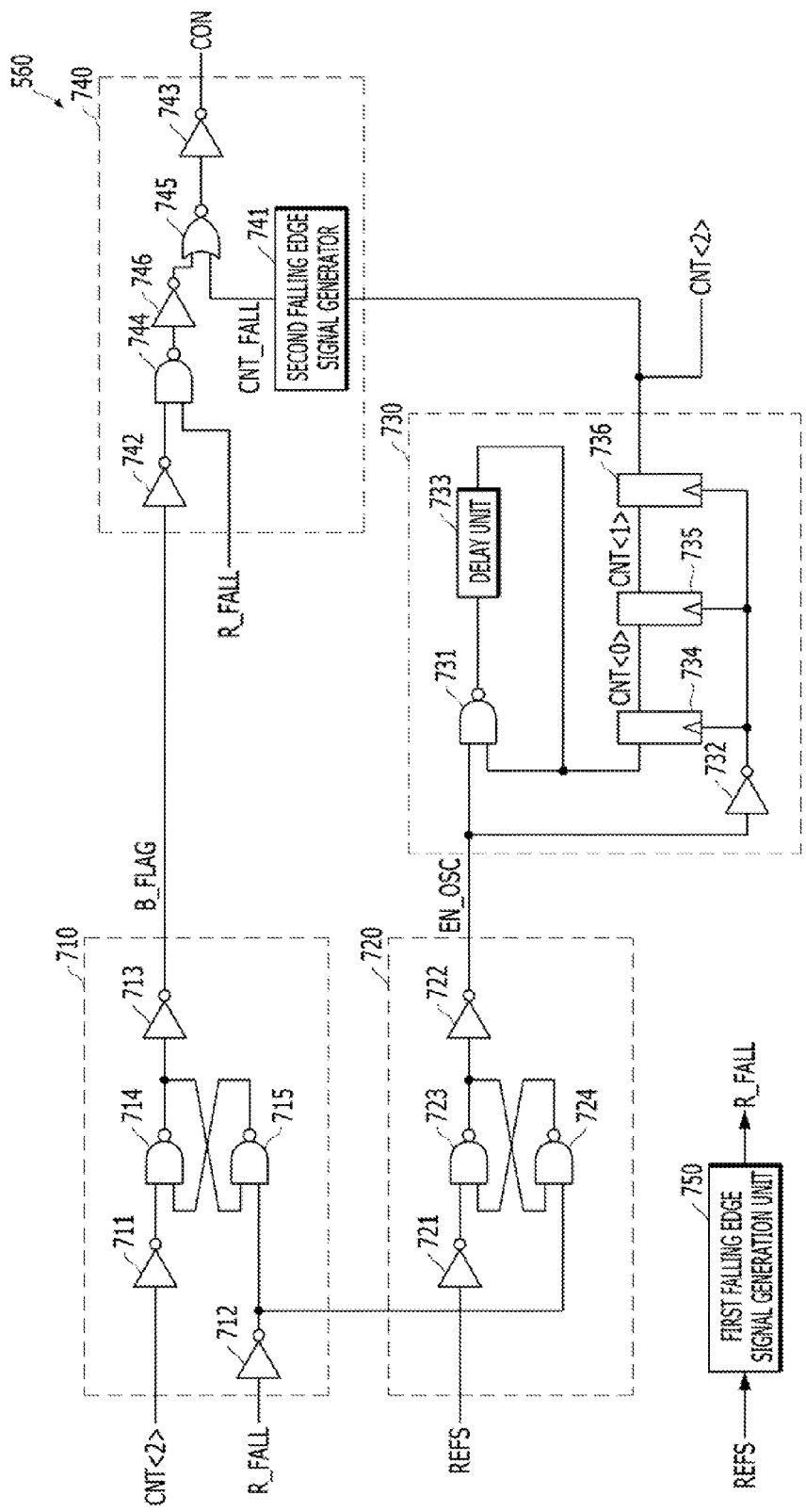
FIG. 7 is a configuration diagram of a control signal generator of the memory device of FIG. 5.

FIG. 7 is a configuration diagram of the control signal generator 560.

Referring to FIG. 7, the control signal generator 560 may include a burst flag generation unit 710, an oscillator control unit 720 an oscillator 730, a signal generation unit 740 and a first falling edge signal generation unit 750.

The burst flag generation unit 710 may generate a burst flag signal BFLAG in response to a counting signal CNT<2> and a first falling edge signal R_FALL. The burst flag signal B_FLAG may toggle at set intervals. The burst flag signal B_FLAG may be retained at a first level, for example, a low level in a skip operation section, and retained at a second level, for example, a high level in a burst refresh operation section. The burst flag generation unit 710 may include inverters 711, 712 and 713 and NAND gates 714 and 715.

The oscillator control unit 720 may generate an enable signal EN_OSC in response to the refresh section signal REFS and the first falling edge signal R_FALL. The oscillator control unit 720 may enable the enable signal EN_OSC when a refresh operation is ended, and disable the enable signal EN_OSC when a refresh operation is started. The oscillator control unit 720 may include inverters 721 and 722 and NAND gates 723 and 724.

The oscillator 730 may generate counting information CNT<0:2> by performing counting at a set interval in a section where the enable signal EN_OSC is enabled. The oscillator 730 may repetitively count the counting information CNT<0:2> from 000 to 111 in the section where the enable signal EN_OSC is enabled. When the enable signal EN_OSC is disabled, the oscillator 730 may reset the value of the counting information CNT<0:2> to 000 and retain the value. The time required for the oscillator 730 to count from 000 to 111 may be set to be longer than the interval at which the refresh command REF is applied, except for the burst refresh operation. The oscillator 730 may include a NAND gate 731, an inverter 732, a delay unit 733 and a plurality of shifters 734 to 736.

The signal generation unit 740 may generate the control signal CON in response to the burst flag signal B_FLAG, the first falling edge signal R_FALL and the counting signal CNT<2>. The signal generation unit 740 may enable the control signal CON to a high level when the first or second falling edge signal R_FALL or CNT_FALL is enabled to a high level in a state where the burst flag signal B_FALG is at a low level, and retain the control signal CON at a low level when the burst flag signal B_FLAG is at a high level.

The signal generation unit 740 may include a second falling edge signal generator 741, inverters 742, 743 and 746, NAND gate 744 and NOR gate 745. The second falling edge signal generator 741 may generate the second falling edge signal CNT_FALL which is activated at a falling edge of the counting signal CNT<2> during a set period.

The first falling edge signal generation unit 750 may generate the first falling edge signal R_FALL which is enabled at a falling edge of the refresh section signal REFS during a set period.

In an embodiment of the present invention, a memory device may include a plurality of word lines WL0 to WLx coupled to a plurality of memory cells MC, a target address generator 540, and a refresh controller 550. The target address generator 540 may include at least two address storage units 610_0 to 610_7 configured to store at least two row hammering addresses. The target address generator 540 may generate a plurality of target addresses TADD in response to the stored row hammering addresses during a burst refresh operation. The refresh controller 550 may refresh the memory cells MC coupled to a plurality of selected word lines among the word lines WL0 to WLx in response to the target addresses TADD during the burst refresh operation.

The at least two row hammering addresses may correspond to a number of times where a refresh command REF is skipped. At least one of the target addresses TADD may be disposed between a pair of the selected word lines. The memory device may include a control signal generator 560 coupled to the target address generator 540. The control signal generator 560 may detect a skip of the refresh command REF and the burst refresh operation. The control signal generator 560 may generate a control signal CON to control the target address generator 540. The control signal generator 560 may enable the control signal CON at a set interval during a refresh skip operation, and disable the control signal CON during the burst refresh operation.

Figure 8:
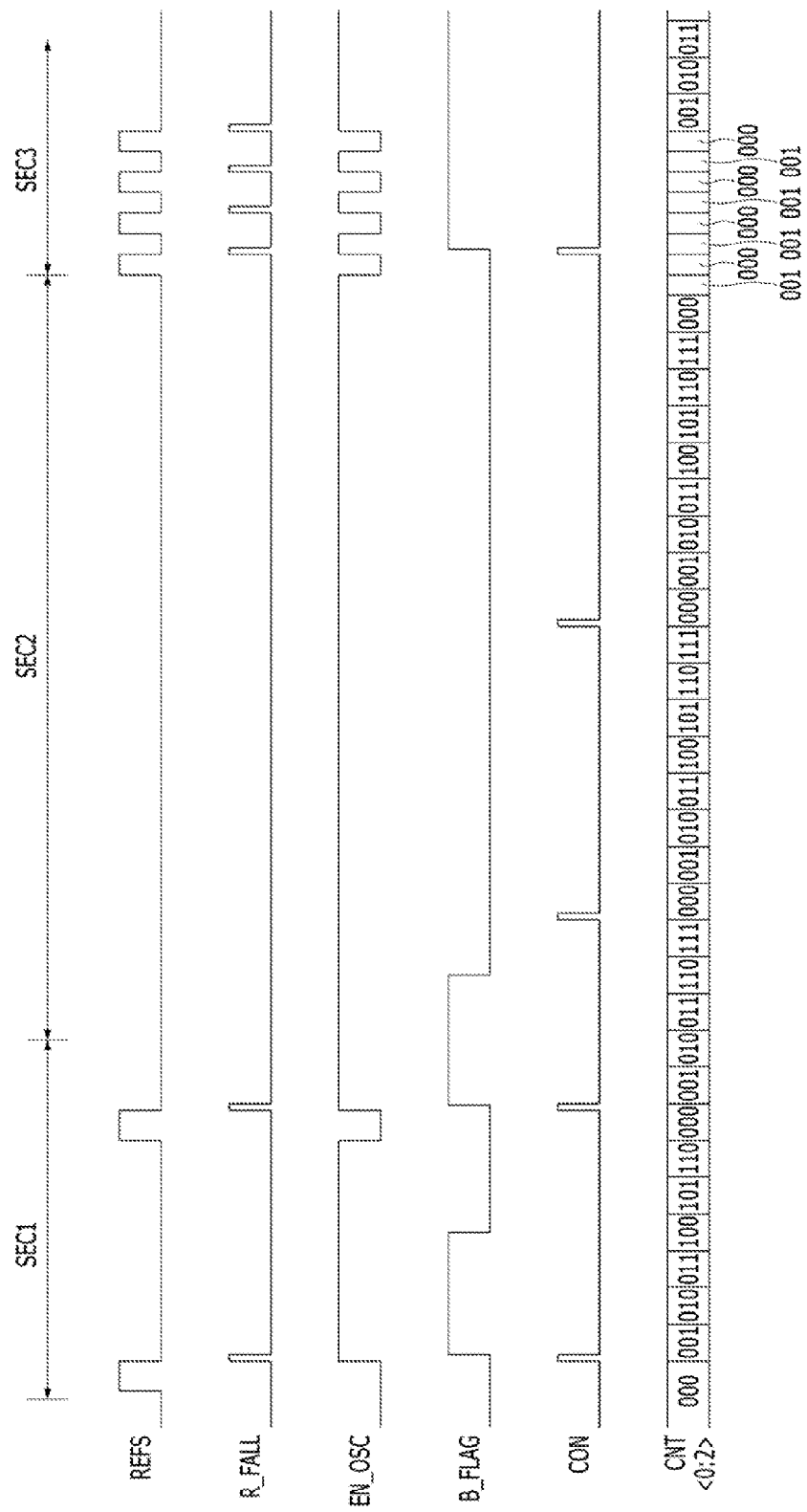
FIG. 8 is a diagram describing an operation of the control signal generator of FIG. 7.

FIG. 8 is a diagram describing the operation of the control signal generator 560.

Referring to FIG. 8, the operation of the control signal generator 560 will be described in a general operation section SEC1, a skip operation section SEC2 and a burst refresh operation section SEC3.

(1) General operation section SEC1 where refresh command REF is applied at first interval.

When the refresh section signal REFS is disabled to a low level and the first falling edge signal R_FALL is enabled, the enable signal EN_OSC is activated to a high level. When the first falling edge signal R_FALL is enabled in a state where the counting signal CNT<2> is 0, the burst flag signal B_FLAG may transition from a low level to a high level. For reference, a logic value 0 may correspond to a low level, and a logic value 1 may correspond to a high level. When the first falling edge signal R_FALL is enabled in a state where the burst flag signal B_FLAG is at a low level, the control signal CON is enabled to a high level.

When the enable signal EN_OSC is enabled, the oscillator 730 may start counting. Since the value of the counting signal CNT<2> changes from 0 to 1 when the value of the counting information CNT<0:2> becomes 100, the burst flag signal B_FLAG may transition from a high level to a low level. When the value of the counting information CNT<0:2> is represented by abc, a may be set to CNT<2>, b may be set to CNT<1>, and c may be set to CNT<0>. Then, when the refresh section signal REFS is enabled to a high level from a low level, the enable signal EN_OSC may be disabled to a low level. When the enable signal EN_OSC is disabled to a low level, the counting information CNT<0:2> may be reset to 000. Then, when the refresh section signal REFS is disabled to a low level and the first falling edge signal R_FALL is enabled, such an operation may be repeated.

In this section, the control signal CON may be enabled at the same interval as the interval at which the refresh command REF is applied, because the control signal CON is enabled in response to the first falling edge signal R_FALL.

(2) Skip operation section SEC1 where refresh command REF is not applied during longer period than first interval.

When the refresh command REF is skipped, the refresh section signal REFS may retain the state in which it is disabled to a low level, and the first falling edge signal R_FALL may not be enabled. Therefore, the burst flag signal B_FLAG may retain the state in which it is disabled to a low level, and the enable signal EN_OSC may retain the state in which it is enabled to a high level. In this section, the oscillator 730 may repetitively count the counting information CNT<0:2> from 000 to 111, and the second falling edge signal CNT_FALL may be enabled to a high level by the second falling edge signal generator 741 at a point of time that the counting information CNT<0:2> changes from 111 to 000 or at a falling edge of the counting signal CNT<2>. When the second falling edge signal CNT_FALL is enabled, the control signal CON may be enabled. Such an operation may be repeated until the refresh section signal REFS is enabled to a high level in response to the refresh command REF and then disabled to a low level.

In this section, the control signal CON may be enabled in response to the second falling edge signal CNT_FALL. Therefore, the control signal CON may be enabled at the same interval as the time required until the counting information CNT<0:2> is counted from 000 and then becomes 000 again. Hereafter, the time will be referred to as a counting cycle. At this time, the counting cycle may be equal to or longer than the interval at which the refresh command REF is applied during the general operation section SEC1.

(3) Burst refresh operation section SEC3 where refresh command REF is applied at shorter interval than first interval.

Since a period in which the refresh command REF is applied is short in the burst refresh operation section SEC3, only 000 and 001 of the counting information CNT<0:2> may be repetitively counted. That is, since the counting signal CNT<2> does not change to 1, the burst flag signal B_FLAG may not transition to a low level, but retain a high level. Furthermore, since there are no falling edges at which the counting signal CNT<2> transitions from 1 to 0, the second falling edge signal CNT_FALL may not be enabled. Thus, the control signal CON may not be activated, but retain an inactive state.

Figure 9:
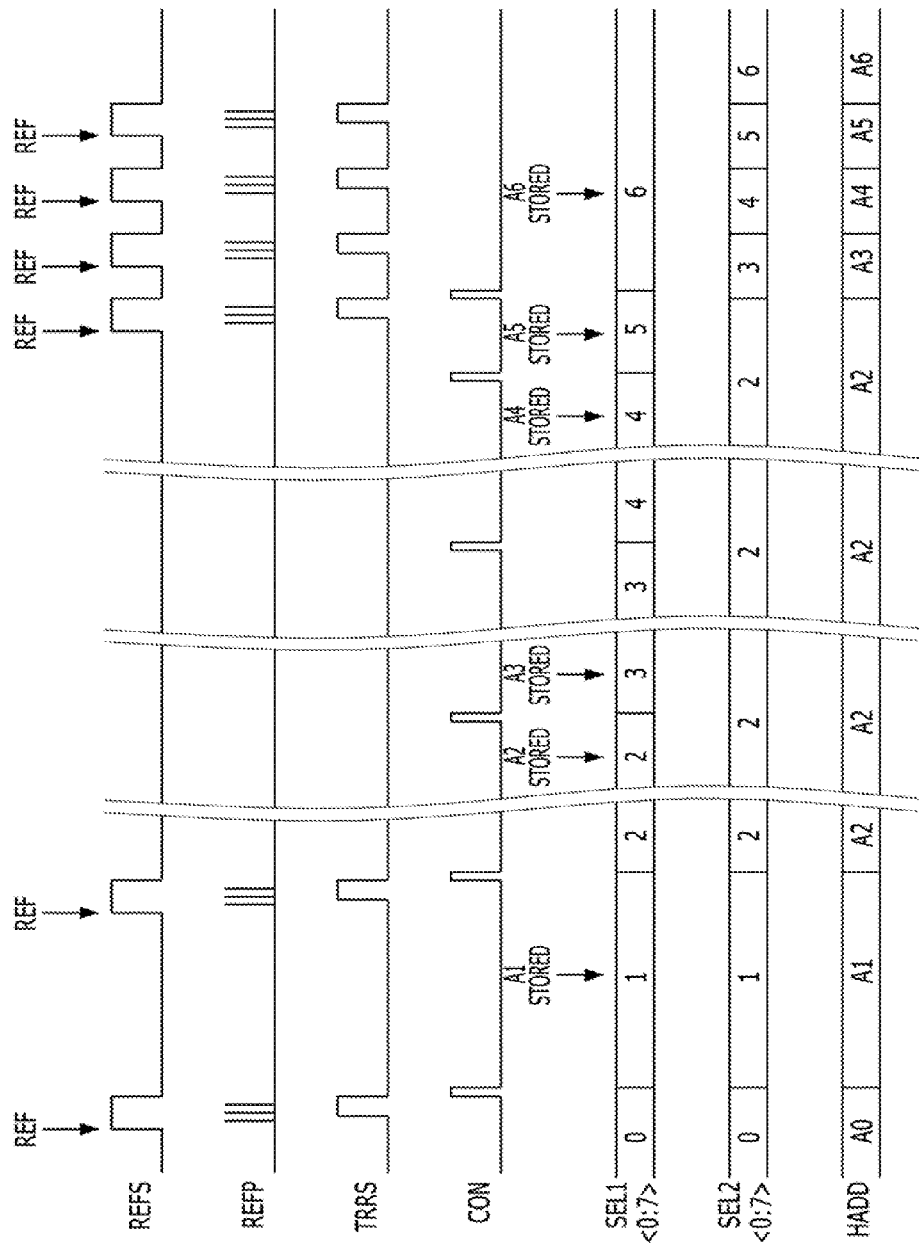
FIG. 9 is a diagram describing a refresh operation of the memory device of FIG. 5.

FIG. 9 is a diagram for describing the refresh operation of the memory device of FIG. 5.

Referring to FIGS. 8 and 9, the refresh operation of the memory device in (1) a general operation section SEC1, (2) a skip operation section SEC2 and (3) a burst refresh operation section SEC3 will be described. Hereafter, the case in which the refresh signal REFP is enabled three times when the refresh command REF is enabled and the target refresh section signal TRRS is enabled at the section where the refresh signal REFP is enabled two times in the section where the refresh section signal REFS is activated will be described.

(1) General operation section SEC1 where refresh command REF is applied at first interval.

Since the first select signal SEL1<0> of the first select signals SEL1<0:7> is enabled, a row hammering address may be stored in the address storage unit 610_0. Since the second select signal SEL2<0> of the second select signals SEL2<0:7> is enabled, a target address TADD may be generated through an address A0 outputted from the address storage unit 610_0. When the refresh signal REFP is activated for the first time in response to the first refresh command REF, a normal refresh operation may be performed. When the refresh signal REFP is activated for the second time, a word line corresponding to TADD=A0−1 may be target-refreshed. When the refresh signal REFP is activated for the third time, a word line corresponding to TADD=A0+1 may be target-refreshed.

When the refresh section signal REFS is disabled and the control signal CON is enabled at a falling edge of the refresh section signal REFS, the enabled first and second select signals may be changed to SEL1<1> and SEL2<1>, respectively. Thus, a row hammering address detected between the refresh command REF applied for the first time and the refresh command REF applied for the second time may be stored in the address storage unit 610_1, and the address A1 outputted from the address storage unit 610_1 may be used to generate a target address when the second refresh command REF is applied. When the refresh section signal REFS is disabled and the control signal CON is enabled, the enabled first and second select signals may be changed to SEL1<2> and SEL2<2>, respectively.

(2) Skip operation section SEC2 where refresh command REF is not applied during longer period than the first interval.

During a period in which the refresh command REF is skipped, the control signal CON may be enabled at the second interval, but the refresh section signal REFS may be retained in an inactive state. Thus, the enabled first select signal may be sequentially changed from SEL1<2> to SEL1<3>, SEL1<4> and SEL1<S>, but the enabled second select signal may be retained as SEL2<2>. That is, row hammering addresses detected between the periods in which the control signal CON is enabled may be sequentially stored in the address storage units 610_2, 610_3, 610_4 and 610_5.

(3) Burst refresh operation section SEC3 where refresh command REF is applied at shorter interval than first interval.

In the burst refresh operation section, the control signal CON may retain an inactive state, and the refresh section signal REFS may be enabled whenever the refresh command REF is applied, and disabled is a set time. However, since the control signal CON is enabled in response to the first refresh command REFS of the burst refresh operation, the enabled first select signal may be changed to SEL1<6> and then retained, but the second select signal may be sequentially changed from SEL2<2> to SEL2<3>, SEL2<4>, SEL2<5> and SEL2<6>. Therefore, the addresses stored in the address storage units 610_2 to 610_6 may be sequentially outputted as addresses A2 to A6 in response to the refresh command REF, and word lines corresponding to a target address generated through the output addresses may be target-refreshed.

The memory device of FIG. 5 may store two or more row hammering addresses detected in a skip operation section, even when the refresh command REF is skipped, and perform a target refresh operation using all of the row hammering addresses during the burst refresh operation. Thus, although the refresh command REF is skipped, the memory device can prevent data deterioration in word lines due to a row hammering effect.

Figure 10:
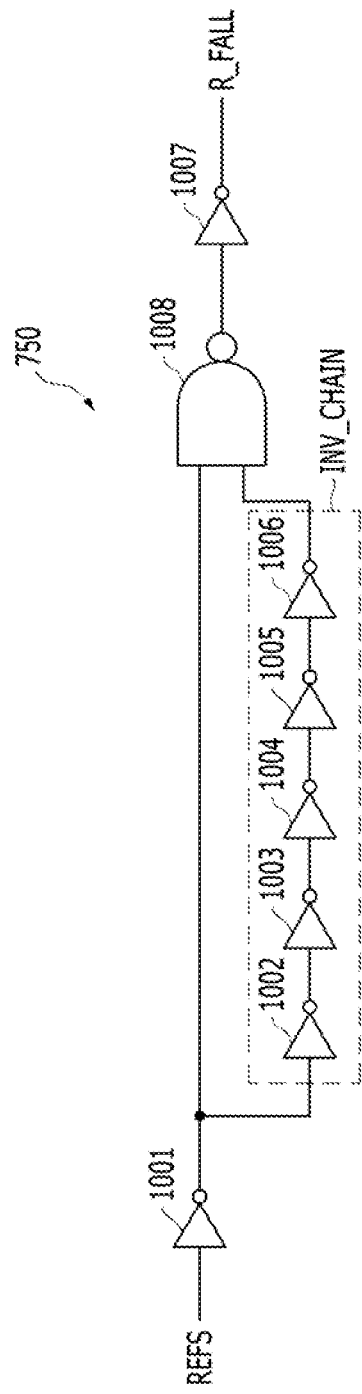
FIG. 10 is a configuration diagram of a first failing edge signal generation unit of the control signal generator of FIG. 7.

FIG. 10 is a configuration diagram of the first falling edge signal generation unit 750.

Referring to FIG. 10, the first falling edge signal generation unit 750 may include inverters 1001 to 1007 and a gate 1008. The first falling edge signal generation unit 750 may generate the first falling edge signal R_FALL which is enabled at a falling edge of the refresh section signal REFS. The inverters 1002 to 1006 may form an inverter chain INV_CHAIN. The inverter chain INV_CHAIN may include an odd number of inverters, and the period in which the first falling edge signal R_FALL is enabled may be adjusted according to the number of inverters included in the inverter chain INV_CHAIN. At this time, the number of inverters included in the inverter chain INV_CHAIN may be proportional to the active period of the first falling edge signal R_FALL.

In accordance with the present embodiments, even when a refresh operation is skipped, the memory device can store one or more addresses satisfying a set condition at a set interval, and perform a target refresh operation using addresses stored during a burst refresh operation. Thus, all of the target refresh operations can be performed.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
  a target address generator configured to store one or more addresses for each time a refresh command is skipped, and generate one or more target addresses for each of the stored addresses during a burst refresh operation, wherein the target addresses are generated by adding or subtracting a set value to or from the stored addresses; and
  a refresh controller configured to refresh a word line selected among a plurality of word lines of a memory bank based on the generated one or more target addresses during a target refresh operation.

2. The memory device of claim 1, wherein when the refresh command is skipped K times the target address generator stores (k+1) target addresses in a section where the refresh command is skipped, K being a natural number including 0.

3. The memory device of claim 1, wherein the refresh command is applied at a set interval, and successively applied (k+1) times during the set interval in the burst refresh operation, when the number of times the refresh command was skipped is k.

4. The memory device of claim 1, wherein the target address generator generates the target address using one address of the addresses stored in the target address generator, when the refresh command is applied during the burst refresh operation.

5. The memory device of claim 4, wherein the refresh controller refreshes the word lines corresponding to the target addresses generated through the target address generator, when the refresh command is applied during the burst refresh operation.

6. The memory device of claim 1, further comprising a control signal generator configured to detect a skip of the refresh command and the burst refresh operation, and generate a control signal for controlling the target address generator.

7. The memory device of claim 5, wherein the control signal generator enables the control signal in response to the refresh command when the refresh command is applied at a first interval, enables the control signal at a second interval equal to or longer than the first interval in a section where the refresh command is not applied, when the refresh command is not applied for a longer time than the first interval, and disables the control signal when the refresh command is applied at a third interval shorter than the first interval.

8. The memory device of claim 7, wherein the target address generator comprises:
a plurality of address storage units;
a first select signal generation unit configured to count the control signal to generate a plurality of first select signals corresponding to the respective address storage units; and
a second select signal generation unit configured to count to generate a plurality of second select signals corresponding to the respective address storage units, when the refresh operation is ended, and
when an activated word line satisfies a set condition, the target address generator stores the address of the activated word line in a first address storage unit corresponding to an enabled first select signal, among the plurality of address storage units, and generates the target addresses using an address stored in a second address storage unit corresponding to an enabled second select signal, among the plurality of address storage units.

9. The memory device of claim 8, wherein the set condition comprises one or more conditions of the condition in which the active count of the activated word line is equal to or more than a reference count and the condition in which the active frequency of the activated word line is equal to or more than a reference frequency.

10. The memory device of claim 8, wherein the target address generator generates the target addresses by adding or subtracting the set value to or from the addresses stored in the address storage units corresponding to the plurality of second select signals.

11. A memory device comprising:
a plurality of word lines;
a control signal generator configured to enable a control signal in response to a refresh command, enable the control signal at a set interval during a refresh skip operation, and disable the control signal during a burst refresh operation;
a target address generator comprising a plurality of address storage units, and configured to sequentially primarily select the plurality of address storage units one by one whenever the control signal is activated and storing a row hammering address in the primarily selected address storage units, and sequentially secondarily select the plurality of address storage units one by one whenever the refresh operation is ended and generating a target address using addresses stored in the secondarily selected address storage units; and
a refresh controller configured to refresh a word line corresponding to the target address among the plurality of word lines, during a target refresh operation.

12. The memory device of claim 11, wherein the control signal generator enables the control signal in response to the refresh command when the refresh command is applied at a first interval, enables the control signal at the set interval during the refresh skip operation in which the refresh command is not applied for a longer time than the first interval, and disables the control signal when the refresh command is applied at a second interval shorter than the first interval during the burst refresh operation, wherein the set interval is a third internal equal to or longer than the first interval.

13. The memory device of claim 11, wherein the target address generator sequentially primarily selects the plurality of address storage units from the first address storage unit to the last address storage unit and sequentially primarily selects the plurality of address storage units again from the first address storage unit after the last address storage unit is primarily selected, and sequentially secondarily selects the plurality of address storage units from the first address storage unit to the last address storage unit and sequentially secondarily selects the plurality of address storage units again from the first address storage unit after the last address storage unit is secondarily selected.

14. The memory device of claim 11, wherein the target address generator comprises:
a first select signal generation unit configured to count the control signal to generate a plurality of first select signals corresponding to the respective address storage units; and
a second select signal generation unit configured to count to generate a plurality of second select signals corresponding to the respective address storage units, when the refresh operation is ended, and
the target address generation unit primarily selects a first address storage unit corresponding to an enabled first select signal, among the plurality of address storage units, and secondarily selects a second address storage unit corresponding to an enabled second select signal, among the plurality of address storage units.

15. The memory device of claim 11, wherein the row hammering address satisfies one or more conditions of the condition in which the active count of the activated word line is equal to or more than a reference count and the condition in which the active frequency of the activated word line is equal to or more than a reference frequency.

16. The memory device of claim 14, wherein the target address generator generates the target addresses by adding or subtracting a set value to or from the addresses stored in the secondarily selected address storage units.

17. A memory device comprising:
a plurality of word lines coupled to a plurality of memory cells;
a target address generator including at least two address storage units configured to store at least two row hammering addresses, and configured to generate a plurality of target addresses in response to the row hammering addresses during a burst refresh operation; and
a refresh controller configured to refresh the memory cells coupled to a plurality of selected word lines among the word lines in response to the target addresses during the burst refresh operation,
wherein the at least two row hammering addresses corresponds to a number of times where a refresh command is skipped.

18. The memory device of claim 17, wherein at least one of the target addresses is disposed between a pair of the selected word lines.

19. The memory device of claim 17, further comprising a control signal generator coupled to the target address generator, and configured to detect a skip of the refresh command and the burst refresh operation, and configured to generate a control signal to control the target address generator.

20. The memory device of claim 19, wherein the control signal generator enables the control signal at a set interval during a refresh skip operation, and disables the control signal during the burst refresh operation.

* * * * *